United States Patent [19]
Dabral et al.

[11] Patent Number: 6,043,682
[45] Date of Patent: Mar. 28, 2000

[54] PREDRIVER LOGIC CIRCUIT

[75] Inventors: Sanjay Dabral, Milipitas; Dilip K. Sampath, Sunnyvale; Alper Ilkbahar, Santa Cruz, all of Calif.

[73] Assignee: Intel Corporation, Santa Clara, Calif.

[21] Appl. No.: 08/997,223

[22] Filed: Dec. 23, 1997

[51] Int. Cl.[7] .................. H03K 19/0175; H03K 19/094
[52] U.S. Cl. ............................... 326/86; 326/83; 326/58; 326/27; 326/17
[58] Field of Search ................................. 326/19, 26, 27, 326/58, 83, 86, 87

[56] References Cited

U.S. PATENT DOCUMENTS

| | | | |
|---|---|---|---|
| 5,043,604 | 8/1991 | Komaki | 326/86 |
| 5,055,713 | 10/1991 | Watanabe et al. | 326/27 |
| 5,424,653 | 6/1995 | Folmsbee et al. | 326/26 |
| 5,684,410 | 11/1997 | Guo | 326/27 |
| 5,850,159 | 12/1998 | Chow et al. | 327/394 |
| 5,877,638 | 3/1999 | Lin | 327/108 |

Primary Examiner—Michael Tokar
Assistant Examiner—Daniel D. Chang
Attorney, Agent, or Firm—Blakely, Sokoloff, Taylor & Zafman LLP

[57] ABSTRACT

A buffer for enabling a signal to be applied to a bus. The buffer includes a first transistor coupled to a bus and a voltage supply. The logic buffer includes a first logic circuit which has an input coupled to receive a data signal and adapted to charge a terminal of the transistor at a first rate in response to a transition in the data signal. A second logic circuit charges the terminal at a faster rate during an initial transition period, until a first preselected condition is met. The buffer also includes a third logic circuit to charge the terminal at a second faster rate during a final transition period, after a second preselected condition is met. A method for controlling a voltage level of a signal applied to a terminal of a transistor includes charging the terminal at a fast rate until a first preselected condition is met. The terminal is then charged at a slower rate, until a second preselected condition is met, at which time the terminal is charged at a second fast rate, which is also greater than the slower rate.

19 Claims, 9 Drawing Sheets

PREDRIVER LOGIC CIRCUIT

BACKGROUND OF THE INVENTION

1. Field of the Invention

The invention relates in general to the field of logic circuits, and, more particularly, to logic circuits used in computer systems. Specifically, the invention relates to a predriver logic circuit to improve the output characteristics of a driver circuit for a bus.

2. Description of the Related Art

Modern computer systems may contain several microprocessors, micro-controllers, and other digital devices connected to each other by a bus. The bus transports data among the microprocessors and other components and is composed of a number of traces. Traces are wire-like connections that are printed on a circuit board and function as transmission lines.

In most modern computer systems, data is in the form of bits (i.e., binary digits). Bits are typically represented as voltages. When positive logic is used, a bit value of one (i.e., a logic one) is generally represented as a high voltage, while a bit value of zero (i.e., a logic zero) is generally represented as a low voltage. A high voltage, as defined in this application, is a voltage substantially equal to a supply voltage $V_{CC}$ when used "on chip" and a supply voltage $V_{DDQ}$ when used for the input/output circuits. A low voltage is a voltage level substantially equal to a ground voltage $V_{SS}$.

FIG. 1 is an equivalent circuit representation of a transmission line 100, which may be used to send information from one location to another. Generally, current is sent from one location along a top rail 103 to a second location, and return current is sent back to the first location along a bottom rail 104. Associated with the rails 103, 104 are several inductors 107 and capacitors 108, which constitute an ideal transmission line having impedance $Z_O$.

One skilled in the art will appreciate that as current flows along the top rail 103, it encounters an inductor with a current-to-voltage relation defined as $$V = L\frac{\partial i}{\partial t}$$

where i is the current through the inductor and V is the voltage across it. This relation indicates that the current flowing through an inductor varies as time varies. Thus, as current flows through the inductor 107, a voltage forms across the inductor 107 and may be stored on a corresponding capacitor 108. As the current continues to progress down the transmission line 100, data is continually stored as voltages on corresponding capacitors 108. In this manner, data may be sent from one location to another.

FIG. 2 illustrates a stylized representation of a conventional driver circuit configuration for a bus that has a transmission line 200. A driver circuit 205 is coupled to the transmission line 200 and a predriver circuit 210. Within the driver circuit 205, there are at least two devices that function essentially as switches 215, 220 and are used to connect the transmission line 200 to the voltage supplies 225, 230. These devices generally have terminals that allow the position of the switches 215, 220 to change and are connected to the predriver circuit 210 by the lines 235, 240, respectively. The switches 215, 220 are typically implemented using NMOS and PMOS devices with an associated resistance. The output resistance associated with the switches 215, 220 is equal to the sum of the resistance of the resistors 216, 221.

The input lines 226, 231 of the predriver circuit 210 may be used to generate signals on the lines 235, 240. An enable input signal may be applied to the line 226, while a data signal may be applied to the line 231. One skilled in the art will appreciate that when the enable line 226 is active, data may be passed from the predriver circuit 210 to the driver circuit 205 on one of the lines 235, 240. In this case, the corresponding switch (e.g., switch 215) would close enabling the data signal to be applied to the transmission line 200. During data transitions, the switches 215, 220 may be closed at the same time, momentarily. When the enable line 226 is not active, the switches 215 and 220 are open, leaving the transmission line 200 undriven (i.e., a signal is not being applied to the transmission line). Because the predriver circuit 210 controls the opening/closing of the switches 215, 220, it affects the application of signals to the transmission line 200.

When the transmission line 200 is connected to one of the voltage sources 225, 230, the transmission line is being "driven" by the driver circuit 205. Associated with the driving of the transmission line 100 is the charging time of the predriver output lines 235, 240. The charging time, as defined in this application, is the length of time needed for the voltage applied to the lines 235, 240 to reach a maximum state voltage. For example, the charge time would be the time that it takes for the voltage at the terminal to reach the voltage $V_{CC}$ if a logic one is being applied to the line 240. The lines 235, 240 are generally charged at an exponential (i.e., RC) charge rate. A very fast RC charge rate behaves similarly to a linear charge rate while the exponential nature is more evident with a slow RC charge rate. One skilled in the art will appreciate that charge rate may refer either to the rate of charging or discharging and will be used in both cases.

If a fast RC charge rate is chosen, the driver circuit 205 is charged extremely fast, which may result in simultaneous switching output noise (i.e., ground bounce). Ground bounce is generally defined in the art as a variation in the ground voltage that occurs when the signals on multiple transmission lines transition from one logic state to another logic state, generating large changes in current over a short period of time (i.e., instantaneous current). Typically, a ground parasitic inductor is connected between a switching device and the ground voltage supply. As previously mentioned, current through an inductor varies with time, which causes a voltage to be present across the inductor. The voltage across the inductor becomes larger as more instantaneous current is routed to the ground supply from multiple transmission lines. Ground bounce generally causes additional propagation delays in the output signal thereby reducing the timing margin at the receiver. Distortion in the shape of the signal may also result from ground bounce.

Alternatively, the predriver circuit 210 may charge the lines 235, 240 at a slow RC charge rate. This charging rate charges these lines fast initially, and later slowly, at an exponential charge rate, which may cause the final voltage level to vary depending on the type of data pattern. For a sustained data stream (e.g., 1-1-1-1), the predriver circuit 210 is generally unable to charge the lines to a rail voltage level (e.g., $V_{CC}$). Data transfer generally involves the transfer of a combination of "ones" and "zeroes" to a single transmission line, which is referred to as a data pattern.

Typically, there are two types of data patterns. A high-frequency data pattern generally oscillates (i.e., the voltage level toggles between two values) every clock cycle. For example, a data pattern such as 1-0-1-0-1-0 is a high-frequency data pattern, assuming that the signals are generated at each clock transition. The voltage level of that data pattern toggles between high and low logic states every clock transition. In contrast, a low-frequency data pattern is generally defined as a data pattern that does not transition at every clock transition (e.g., 1-1-0-0-1-1-0-0). During slow RC charging, one state in a high-frequency pattern charges to a voltage level different from the same state in a low-frequency pattern, as will be discussed in greater detail below.

FIG. 3 is a timing diagram illustrating how the output voltage for a predriver circuit varies with time for fast and slow RC charge rates. The signal 300 illustrates the variation of the output voltage for a fast RC charge rate. In the region labeled 305 corresponding to a first bit cell, the voltage quickly reaches the maximum state voltage (e.g., $V_{CC}$) and remains at that voltage for the remaining time in the bit cell. A bit cell, as defined in this application, is the period of time in which one data bit is valid. The signal 300 illustrates similar behavior for the regions labeled 306 and 307.

A slow RC charge rate generates the signal 302. Within the region 305, this signal charges to a voltage $V_1$, while within the region 307, this signal charges to a considerably larger voltage level $V_2$, indicating data pattern dependent charging. One skilled in the art will appreciate that the region 307 actually consists of two consecutive bit cells that correspond to two logic ones. Thus, FIG. 3 illustrates that a 1-0-1-1 data pattern would charge to a different voltage level than a 1-0-1-0 data pattern. The charging to different voltage levels for the same state may cause the driver circuit to behave differently (e.g., the line may take longer to settle). This aberrant behavior may vary the timing requirements for proper operation and affect signal quality.

Conventional predriver circuits generally charge the select terminals of the driver circuit at a rate between the fast and slow RC charge rates. The amount of ground bounce and data pattern dependent charging may be reduced by varying the driver edge rate (i.e., the change in voltage with time) to match the stub length in a bus. The voltage variation for this rate is shown as the signal 303 in FIG. 3. Though the ground bounce at this rate is considerably lower, the ground bounce is still present and may lead to false logic signals. Similarly, though the amount of data pattern dependent charging is considerably lower, it is still present, which may impact signal quality, among other things. Thus, it would be beneficial to have a predriver logic circuit that is capable of overcoming the shortcomings of conventional predriver logic circuits.

SUMMARY OF THE INVENTION

The invention relates to a buffer for enabling a signal to be applied to a bus. The logic buffer includes a first two transistor coupled to a bus and a voltage supply. The buffer also includes a first logic circuit which has an input coupled to receive a data signal and adapted to charge a terminal of the transistor at a first rate in response to detecting a transition in the data signal. A second logic circuit charges the terminal initially until a first preselected condition is met, at which time the slower first rate is employed. The buffer also includes a third logic circuit to charge the terminal at a second fast rate during a a final period after a second preselected condition is met.

A method for controlling the voltage level of a signal applied to a terminal of a transistor includes charging the terminal at a first fast rate until a first preselected condition is met. The terminal is then charged at a second rate, which is slower than the first rate, during a final period. The terminal is charged at a third rate, which rate is also greater than the first rate.

BRIEF DESCRIPTION OF THE DRAWINGS

Other objects and advantages of the invention will become apparent upon reading the following detailed description and upon reference to the drawings in which.

Figure 1:
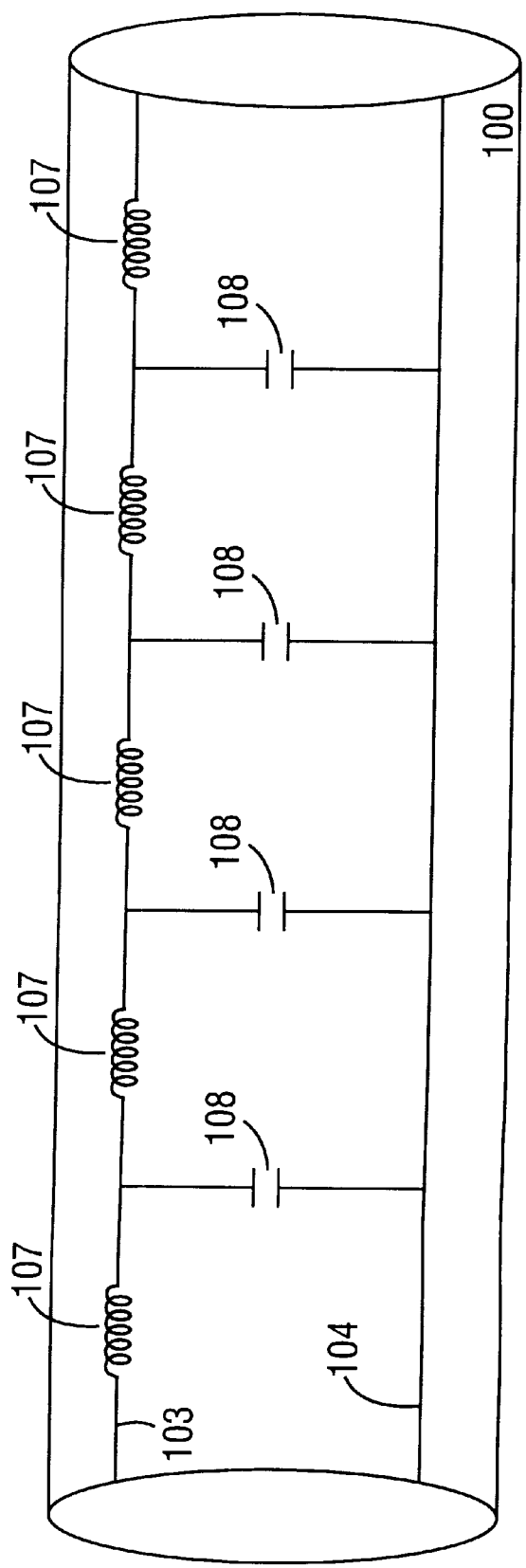
FIG. 1 is a simplified representation of a transmission line.
Figure 2:
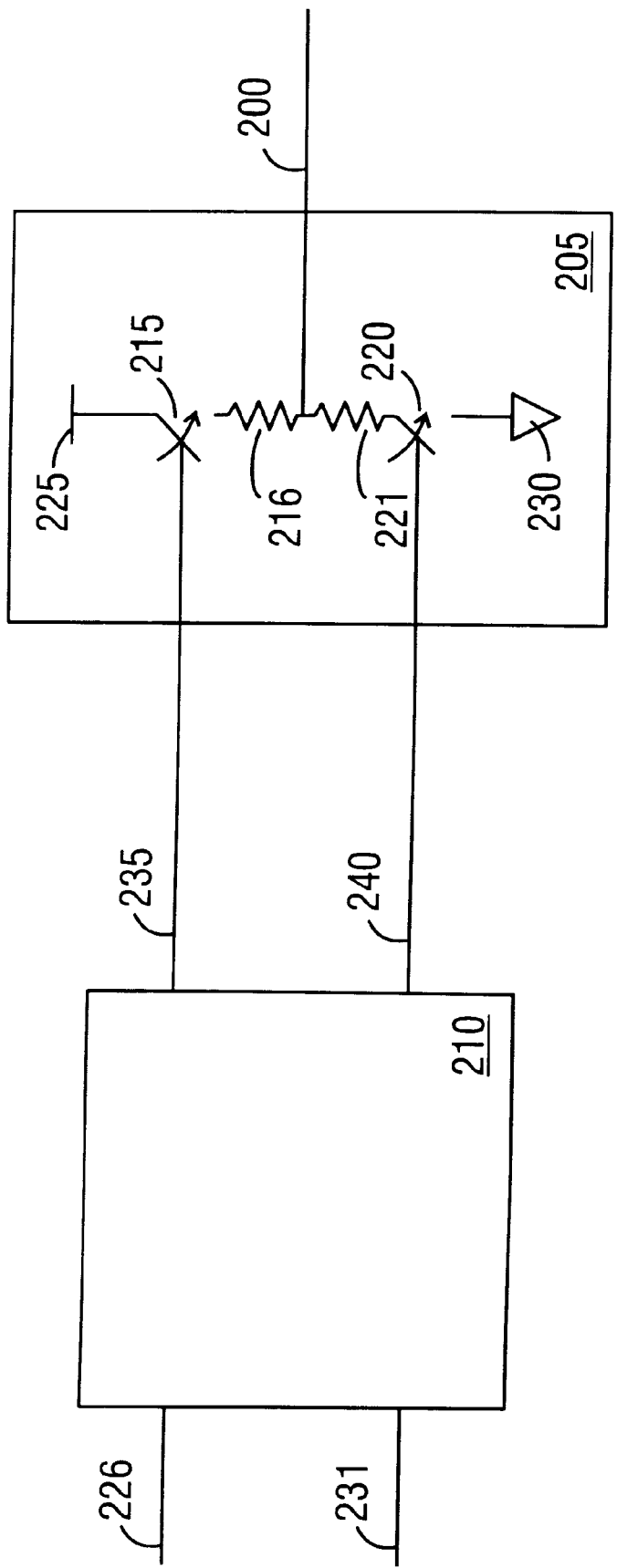
FIG. 2 is a simplified diagram of a conventional bus driver configuration.
Figure 3:
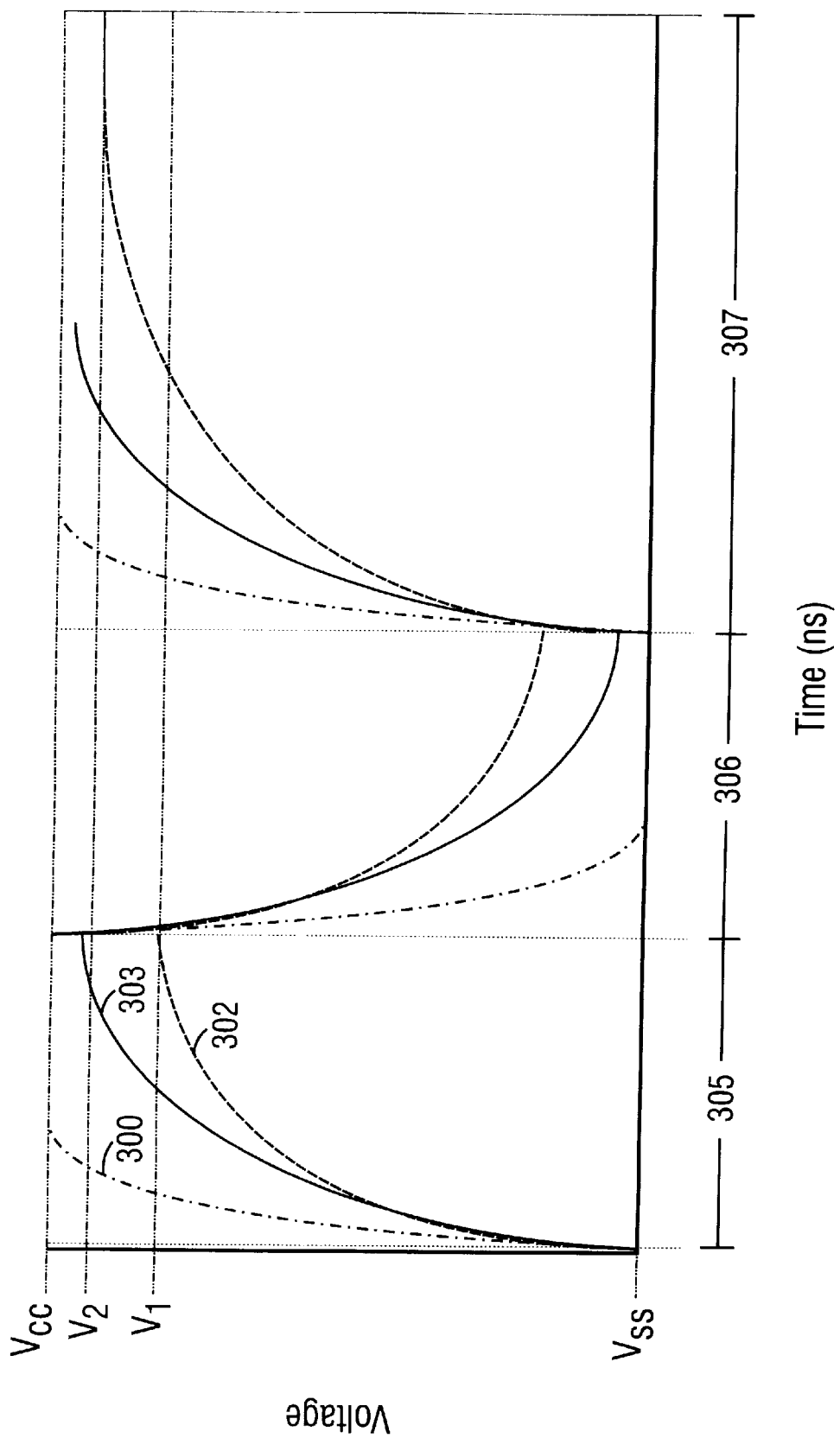
FIG. 3 is a timing diagram illustrating the output voltage of a conventional predriver circuit.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below as they might be employed in a predriver logic circuit. In the interest of conciseness, not all features of an actual implementation are described in this specification. It will of course be appreciated that in the development of any actual embodiment, numerous implementation-specific decisions must be made to achieve the developer's specific goals, such as compliance with system-related and business-related constraints. Moreover, it will be appreciated that even if such a development effort might be complex and time-consuming, it would nevertheless be a routine undertaking for one of ordinary skill having the benefit of this disclosure.

Overview

As previously mentioned, digital signals are generally defined as signals that have two states (e.g., a high state and a low state) in which the voltage level of each of the states is within a predetermined range. Ideally, a transition between digital states occurs instantaneously, resulting in a vertical line that has an infinite slope. In actuality, a digital signal changes state over a specified period of time, providing a non-infinite slope that is equal to the time rate of change of the signal voltage. The time rate of change from one state to another state for a digital signal is defined as the slew rate. The slew rate of a digital signal defines the signal quality, the amount of simultaneously switching output noise, and the compliance of the signal with designated timing requirements. One skilled the art will appreciate that these factors may be used to set the slew rate.

A driver logic circuit, functions as an amplifier with a gain that is related to the voltage applied at an input terminal. Associated with the driver logic circuit is a gain curve which indicates how the gain varies as the applied input terminal voltage varies. By utilizing the gain curve, the predriver logic circuit of the present invention is able to effectively charge terminals of the driver logic circuit in a manner that minimizes simultaneously switching output noise, while maintaining signal quality and compliance with designated timing constraints.

Figure 4:
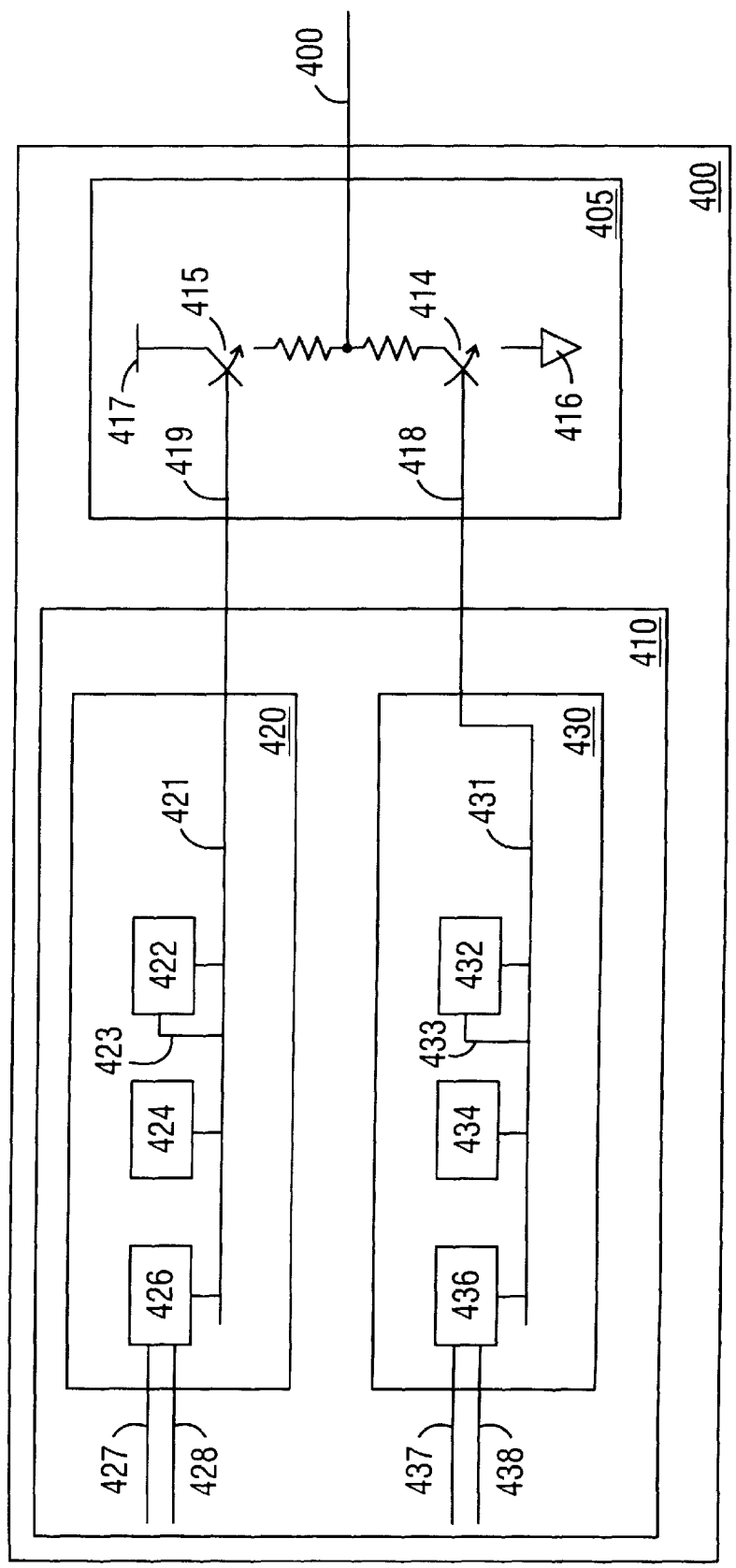
FIG. 4 is a simplified diagram for a bus driver configuration in accordance with the invention.

FIG. 4 is a simplified diagram illustrating a mechanism for applying a signal to a transmission line 400 using a driver circuit 405 and a predriver circuit 410 in accordance with the invention. The driver circuit 405 includes two switches 414, 415 which are coupled to the voltage supplies 416, 417, respectively. The voltage supply 417 may generate a logically "high" voltage, while the voltage supply 416 may generate a logically "low" voltage. As previously mentioned, the signal applied to the terminals 418, 419 by the predriver circuit 410 may be used to control the opening and closing of the switches 414, 415.

The complete predriver circuit 410 includes pull up network 420 and a pull down network 430 which can be used to drive the transmission line to a logically high and low level, respectively. A line 431 within the predriver network 430 is connected to the line 418 and three logic devices 432, 434, 436. The logic device 436 may be used to charge the line 418 at a slow RC throughout a valid data bit cell. The logic device 434 may be used to charge the line 418 at one fast RC charge rate during an initial portion of the valid data bit cell. Finally, the logic device 432 may be used to charge the line 418 at a second fast RC charge rate during a final portion of the valid data bit cell. This final charging may be used to quickly bring the line 431 to a rail voltage.

One skilled in the art will appreciate that each of the logic devices 432, 434, 436 may be used to independently control the opening/closing of the switch 414. The logic circuit 436 has two input terminals 437, 438 on which signals may be applied. This logic circuit is designed such that the application of input signals to the input terminals 437, 438 applies a signal to the line 431 to open/close the switch 414. The logic devices 432, 434, 436 are essentially connected in parallel enabling them to be used independently or simultaneously. The logic devices 432, 434 may also contain a feedback line 433 (e.g., logic circuit 432), which turns a given device "on" or "off" when predefined conditions are met.

The predriver network 420 may be designed similar to the predriver network 430 using devices 422, 424, 426 to control the switch 415 appropriately. Thus, the predriver circuit 410 of the present invention enables three independently operating logic devices 422, 424, 426; 432, 434, 436 to apply signals to the lines 418, 419 to enable the driver circuit 405 with minimal switched signal output noise (i.e., ground bounce) and data-pattern dependent charging without sacrificing signal quality.

A First Embodiment

Figure 5A:
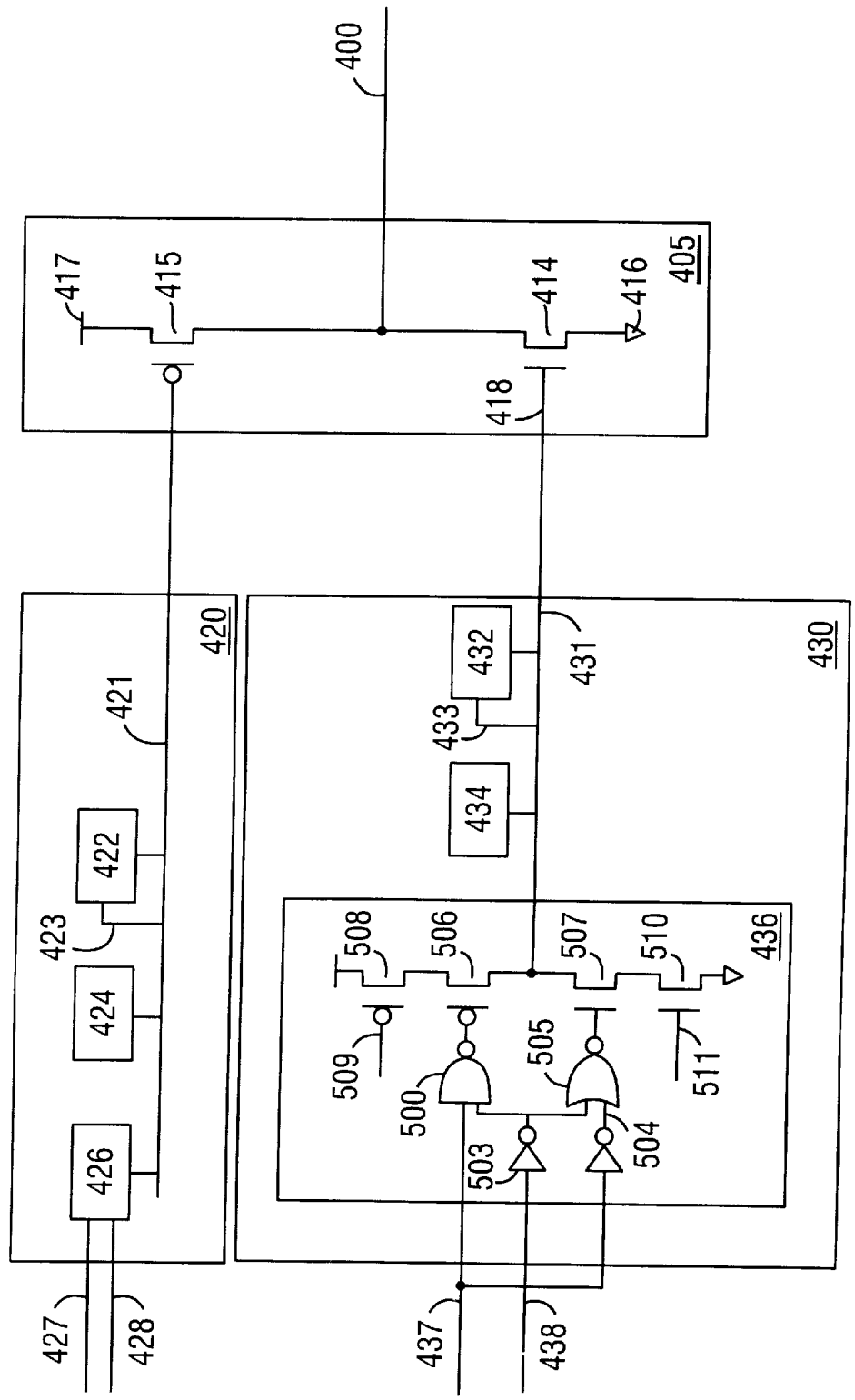
FIGS. 5A–5C are detailed circuit diagrams of a first embodiment of the predriver circuit of FIG. 4.

FIG. 5A is a circuit diagram for a first embodiment of the predriver circuit 410 that is coupled to the transmission line 400 through the driver circuit 405. The driver circuit 405 has two complementary metal oxide semiconductor (MOS) transistors 414, 415 that function essentially as switches. One skilled in the art will appreciate that the transistors 414, 415 may be replaced by any transistor topology allowing for complementary transistors (e.g., bipolar transistors and field effect transistors). The PMOS transistor 415 has a source terminal coupled to the reference voltage supply 417, a gate terminal coupled to the predriver circuit 410 by the line 419, and a drain terminal coupled to the transmission line 400. The voltage level of the signal applied to the line 419 is used to enable (i.e., turn "on") the transistor 415. Enabling the transistor 415 allows current to flow from the source to the drain such that a supply voltage (e.g., $V_{CC}$) may be applied to the transmission line 400. When a logic zero (i.e., a logically "low" voltage) is applied to the line 419, the PMOS transistor 415 turns "on," allowing the logically "high" voltage from the voltage supply 417 to be applied to the transmission line 400. In contrast, the application of a logic one (i.e., a logically "high" voltage) to the line 418 turns the NMOS transistor 414 "on," applying a logically "low" voltage from the voltage supply 416 to the transmission line 400.

Associated with the turning "on"/"off" of transistors, there is a voltage at which channels form within the transistor and electrical carriers begin to flow more freely. This voltage is generally referred to as the threshold voltage $V_T$. When voltages above the threshold voltage $V_{TN}$ are applied to the gate terminal of a transistor, it begins to conduct current. As previously mentioned, both logic zero and logic one signals have a range of voltages associated with them. The threshold voltages for both PMOS $V_{TP}$ and NMOS $V_{TN}$ transistors lie within these ranges.

The predriver network 430 is also coupled to the logic device 436, which functions as a data enabled predriver circuit with a customized slow RC charge rate. One skilled in the art will appreciate that the predriver network 430 in which functions as an output NMOS circuit, while the predriver network 420 functions as an output PMOS network. The input lines 437, 438 of the data enabled predriver circuit 436 may be used to generate an output signal on the line 431. The data enabled predriver circuit 436 may be designed to generate the appropriate valid data signal on the line 431 for every data transition. A data signal may be applied to the line 438 and sent through an inverter 503 to the NAND gate 500 and the NOR gate 505. An enable signal may be applied to the line 437 and the logical inverse of this signal may be applied to the line 504. The outputs of the NAND and NOR gates 500, 505 are coupled to the enables of the transistors 506, 507. Alternative implementations for the data enabled predriver circuit 436 are possible without departing from the inventive concepts of the present invention.

When the enable and data signals on the lines 437, 438 are both a logic one, the transistor 506 turns "on." Transistor 507 turns "on" when the data signal on the line 438 is a logic one and the enable signal on the line 436 is a logic zero. These transistors function essentially as switches such that when they are turned "on," they enable a signal to be applied to the line 431. The transistor 508, 510 are connected in series with the transistors 506, 507 and are coupled to the voltage supplies 417, 416, respectively. A control signal is applied to the terminal 509 and its logical inverse is applied to the terminal 511. One skilled in the art will appreciate that it is also possible to apply an analog signal with a value in between a reference voltage and a ground voltage to the terminals 509, 511. These transistors allow the "driving" strength of the logic circuit 436 to be adjusted.

Figure 5B:
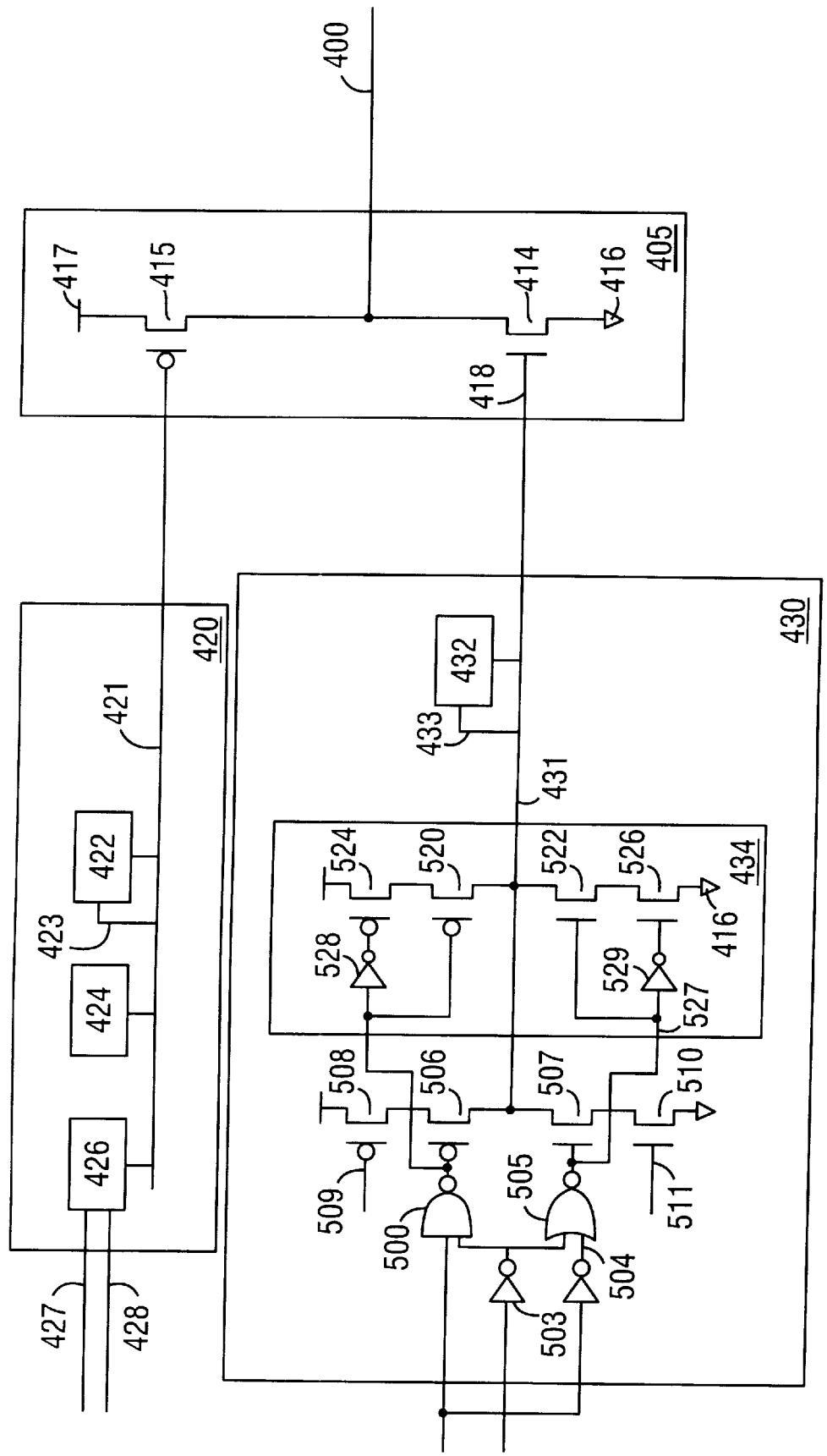

FIG. 5B illustrates one possible implementation of the logic circuit 434 which essentially functions as an early boost circuit with a first fast RC charge rate. This circuit may be designed with four serial transistors 520, 522, 524, 526 and two inverters 528, 529. The gates of the transistors 522, 526 are coupled through the inverter 529. If the output of the inverter were previously a logic one, the transistor 526 would be "on", while the transistor 522 would be "off". When the signal on the line 527 is a logic one, the transistor 522 would turn "on", while the transistor 526 is "on", thereby providing a strong predriver pull-down on the line 431. After some delay, the transistor 526 will turn "off," disconnecting the line 431 from the voltage source 416. The upper portion (i.e., the transistors 520, 524, and the inverter 528) of the early boost circuit functions essentially the same. The length of the delay may be selected based on the amount of time it takes for the voltage on the line 418 to reach the threshold voltage $V_{TN}$ for the transistor 414. Shortly after the data transitions, output signals will be generated by the NAND and NOR gates 500, 505, which will be sent to the transistors 520, 522 to activate the early boost circuit 434.

Figure 5C:
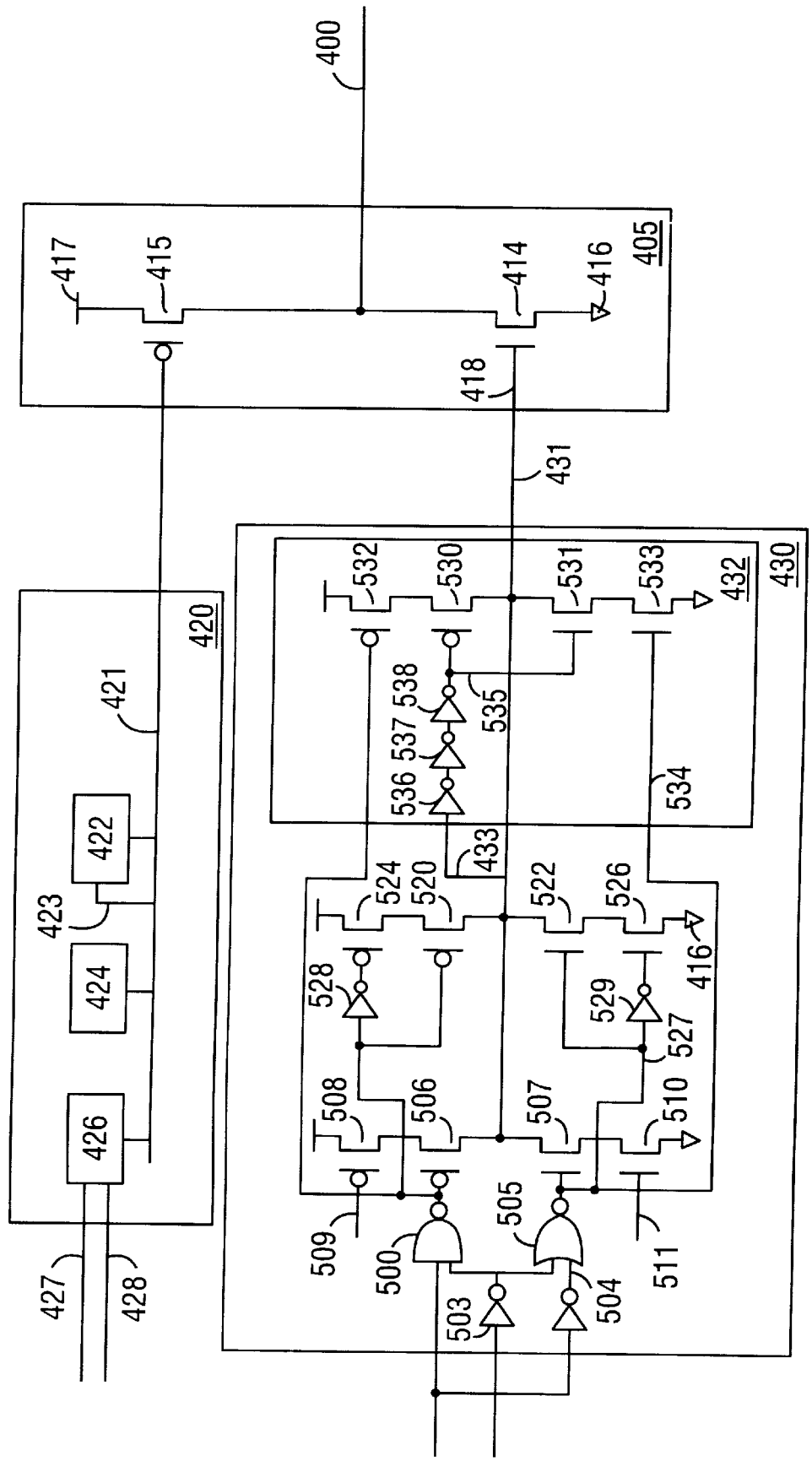

FIG. 5C illustrates one implementation for the final boost logic circuit 432, which includes the serially connected transistors 530–533 and inverters 536–538. When data transitions, at least one of the transistors 532, 533 is turned "on." If the transistor 533 is turned "on" because of the signal applied to the line 534, the line 431 is not pulled low until the signal on the line 535 is a logic one. If the present logic state on the line 431 is a logic zero, a logic one would appear on the line 535 after some extended delay, turning the transistor 531 "on." The logic circuit 432 would then rapidly pull the line low at a second fast RC charge rate.

One skilled in the art will note that the trip point delay of the final boost circuit 432 is considerably longer than the disconnect delay of the early boost circuit 434. The trip point may be adjusted by adjusting the size of the inverters 536–538. Thus, the early boost circuit 434 will be disabled long before the final boost circuit 432 is enabled. As previously mentioned, the early boost circuit 434 is enabled providing a first fast RC charge rate until the driver transistor (e.g., transistor 414) begins to turn "on." The data enabled predriver circuit 436 then continues to pull the line down at a slow RC charge rate until a second voltage $V_Z$ is reached. Finally, the boost circuit 432 pulls the line the remainder of the way at a second fast RC charge, ensuring that the rail voltage is reached by the end of the bit cell.

One skilled in the art will appreciate that, by using the logic circuits 432, 434, 436, the gate of the transistor 414 may be charged at three different rates. The output PMOS network 420 is designed using similar principles as the output NMOS network 430. The output PMOS network 420 applies signals to the line 419 to charge the gate of the transistor 415 at three different rates. One skilled in the art will appreciate that the output PMOS network 420 is functionally equivalent to the output NMOS network 430.

A Second Embodiment

Figure 6:
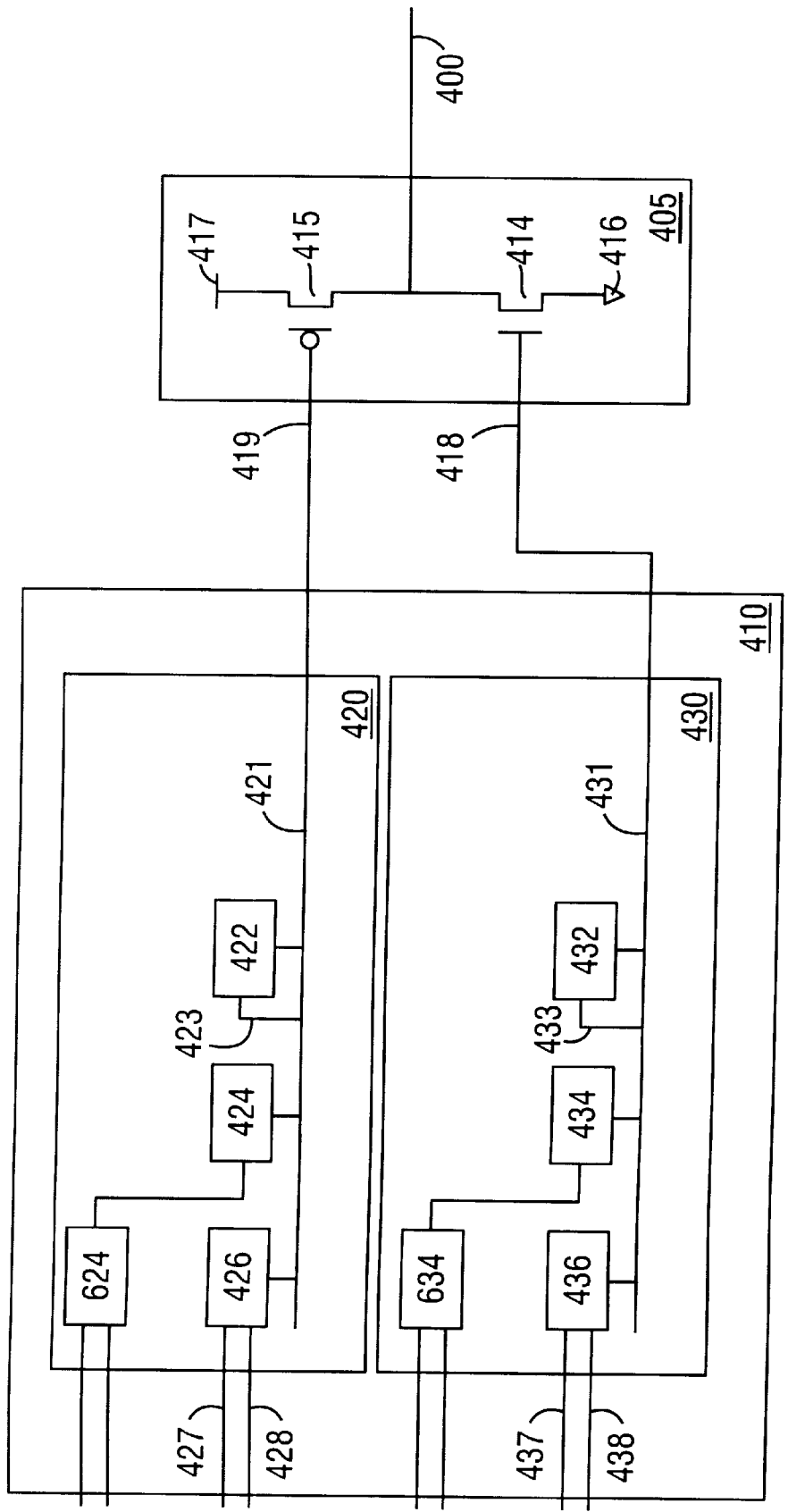
FIG. 6 is a detailed circuit diagram of a second embodiment of the predriver circuit of FIG. 4.

FIG. 6 is a circuit diagram of a second embodiment of the predriver circuit 410 in accordance with the invention. The output PMOS network 420 and output NMOS network 430 include pulse generators 624, 634 coupled to the logic circuits 424, 434, respectively. Each of these pulse generators have two input terminals 625, 626; 635, 636 on which a data signal and an enable signal may be applied. The pulse generators 624, 634 may be used to enable the logic circuits 424, 434 for a predetermined amount of time. The predetermined period of time may be designed to correspond to the time that it takes to charge the gates of transistors 414, 415 to the appropriate threshold voltage.

Once this time has been determined, a pulse may be emitted by the pulse generators 624, 634 that has a duration corresponding to this threshold charge time. The specifics regarding pulse generation have not been included so as not to obscure the present invention. Rather, the relationship of the pulse generator to the transistors 414, 415 has been disclosed to indicate the similarity between embodiments. Thus, this embodiment is designed to function essentially identically to the first embodiment except that it allows one portion of the charge cycle to be determined by time and not voltage.

Figure 7:
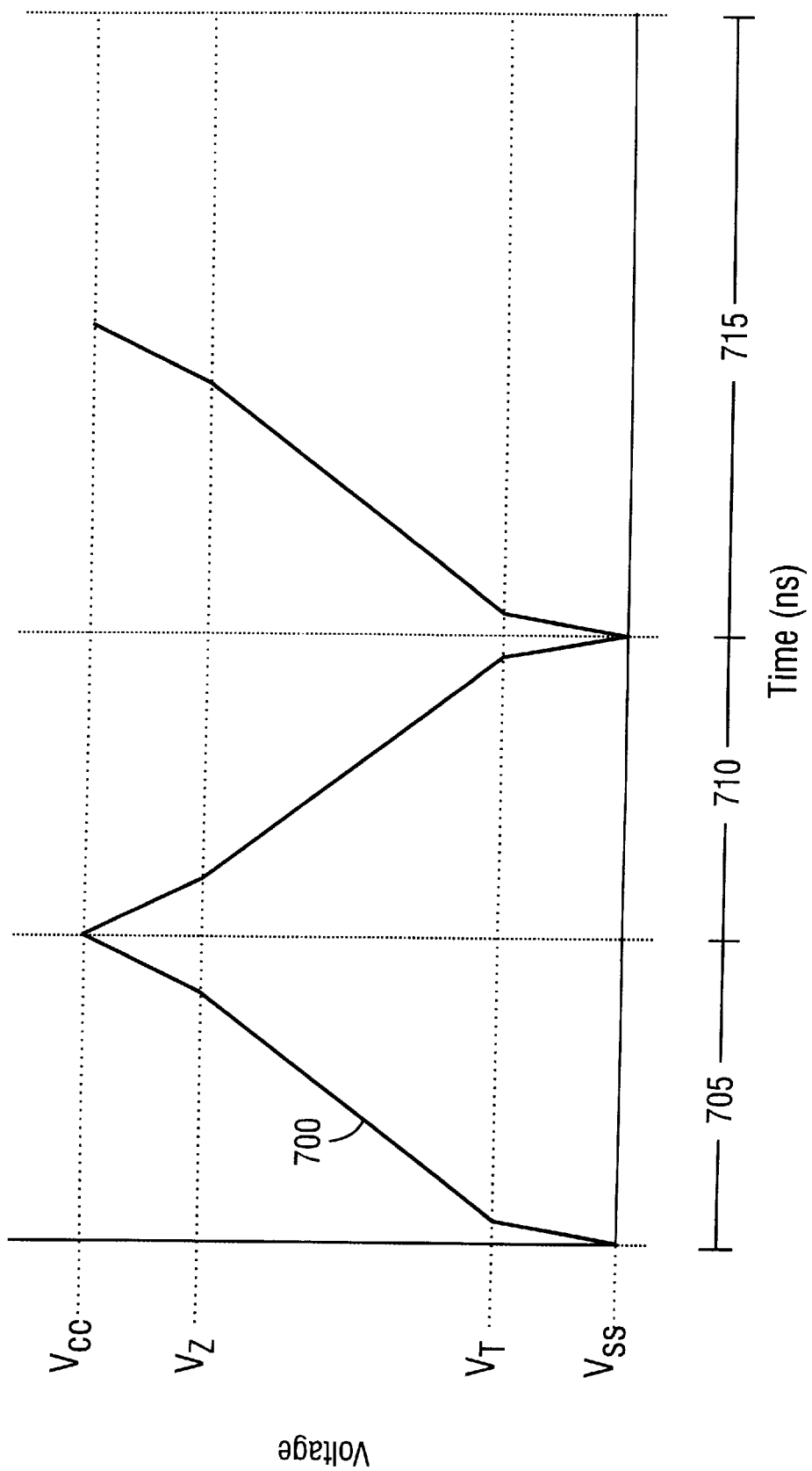
FIG. 7 is a timing diagram illustrating output voltage of a predriver circuit in accordance with the invention.

A predriver logic circuit 410 in accordance with the invention allows the gate of a driver circuit 405 to be charged at three different rates using preselected conditions in order to minimize ground bounce and the data pattern dependent charging level. One skilled in the art will appreciate that the preselected conditions may be time, voltage, or charge. Yet, the present invention also enables the quality of the signal to be maintained. This predriver also reduces timing variations in the transmitted data and signal shape distortion. A timing diagram indicating the output voltage variation with time is shown in FIG. 7. The signal 700, which occurs during bit cell 705, rises at a first fast RC rate until it reaches the voltage $V_T$ and then continues to rise at a slow RC rate until it reaches a voltage $V_Z$. Finally, it is charged at a second fast RC rate until it reaches the maximum state voltage $V_{CC}$. One skilled in the art will appreciate that the behavior of the signal 700 would be the same for bit cells 710 and 715. At the end of each bit cell, the gate terminal is at the rail voltage, which essentially eliminates the data pattern dependent charging level.

This invention brings the driver circuit 405 to the threshold voltage level rapidly, thus reducing the time required for data to appear at the output. When the driver circuit 405 is enabled, the RC charge rate is selected to minimize the signal switched output noise (i.e., ground bounce) and maintain signal quality. Once the driver circuit 405 has switched a significant amount of current, the driver circuit gate voltage is rapidly pulled to the rail voltage, thus reducing the data pattern dependent charging level. Charge ratios in accordance with this invention may be used to notify interrelated parameters of a low output time, control ground bounce, and reduce intersymbol interference. The present invention allows the slew rate of a signal to be cleverly adjusted by improvements in timing, signal quality, and the reduction of ground bounce.

It will be appreciated by those of ordinary skill in the art having the benefit of this disclosure that numerous variations from the foregoing illustration will be possible without departing from the inventive concept described herein. Accordingly, it is the claims set forth below, and not merely the foregoing illustration, which are intended to define the exclusive rights of the invention.

What is claimed is:

1. A driver for controlling a transition of a signal output onto an output terminal comprising:
   a first logic circuit having its input coupled to receive an input and being adapted to change a state of the output terminal at a first rate of change to provide a particular transition of the signal output;
   a second logic circuit coupled to said first logic circuit to increase a rate of change of the transition to a second rate of change which is faster than the first rate of change, during an initial period of the transition; and
   a third logic circuit coupled to said first logic circuit to increase a rate of change of the transition to a third rate of change which is faster than the first rate of change, during a final period of the transition, the initial and final periods of transition being separated by the first rate of change.

2. The driver of claim 1, wherein said first logic circuit includes a complementary pair of transistors coupled to a bus for driving the output terminal.

3. The driver of claim 2, wherein said third logic circuit includes circuitry to detect when a voltage level on the bus reaches a preselected voltage and initiates the final period.

4. The driver of claim 3, wherein said second logic circuit includes a a pulse generator coupled to pulse for a predetermined period of time to establish the initial period.

5. The driver of claim 4, wherein the initial period of the transition is determined to end at about a threshold voltage level of a transistor device.

6. The driver of claim 1, wherein said first, second and third logic circuits are comprised of transistors that are selected from the group consisting of metal oxide semiconductor transistors, bipolar junction transistors, and field effect transistors.

7. A predriver for driving a gate of a driver transistor, which is one of a pair of complementary transistors driving an output, said predriver for controlling a transition of a signal on the output comprising:

a first logic circuit having its input coupled to receive an input and being adapted to change a state of the output at a first rate of change to provide a particular transition of the signal output;

a second logic circuit coupled to said first logic circuit to increase a rate of change of the transition to a second rate of change which is faster than the first rate of change, during an initial period of the transition; and a third logic circuit coupled to said first logic circuit to increase a rate of change of the transition to a third rate of change which is faster than the first rate of change, during a final period of the transition, the initial and final periods of transition being separated by the first rate of change.

8. The predriver of claim 7, wherein said first logic circuit includes a second complementary pair of transistors coupled to a bus for driving the driver transistor.

9. The predriver of claim 8, wherein said third logic circuit detects when a voltage level on the bus reaches a preselected voltage and initiates the final period.

10. The predriver of claim 9, wherein said second logic circuit includes a pulse generator coupled to pulse for a predetermined period of time to establish the initial period.

11. The predriver of claim 9, wherein the initial period of the transition is determined to end at about a threshold voltage level of a transistor device.

12. The predriver of claim 9, wherein said first, second and third transistors are comprised of transistors that are selected from the group consisting of metal oxide semiconductor transistors, bipolar junction transistors, and field effect transistors.

13. A method for controlling a voltage transition of a signal driven onto a terminal comprising:

establishing a first preselected rate of change for the voltage transition;

increasing a rate of change of the voltage transition to a second preselected rate during an initial period of the voltage transition;

increasing a rate of change of the voltage transition to a third preselected rate during a final period of the voltage transition; and driving the terminal with the voltage transition to ensure higher rate of change at initial and final periods, the initial and final periods being separated by a portion having the first preselected rate of change.

14. The method of claim 13, wherein the initial period is determined to end at about a threshold level of a transistor device.

15. The method of claim 13, wherein the initial period and the first preselected period of transition are partially overlapping.

16. The method of claim 13, wherein the final period and the first preselected period of transition are partially overlapping.

17. The method of claim 13, wherein the final period begins in response to reaching a preselected voltage level.

18. An apparatus for controlling a voltage level of a signal output, comprising:

means for changing the voltage level at a first rate of change to provide a particular transition of the signal output;

means for increasing a rate of change of the voltage during an initial period of the transition; and means for increasing a rate of change of the voltage during a final period of the transition, the initial and final periods being separated by the first rate of change.

19. A buffer for controlling a transition of a signal applied to an output terminal comprising:

first means for changing the signal at a first rate of change to provide a particular transition;

second means for increasing a rate of the signal transition during an initial period of the transition; and third means for increasing a rate of the signal transition during a final period of the transition, the initial and final periods being separated by the first rate of change.

* * * * *

UNITED STATES PATENT AND TRADEMARK OFFICE
CERTIFICATE OF CORRECTION

PATENT NO.    : 6,043,682                                    Page 1 of 1
DATED         : March 28, 2000
INVENTOR(S)   : Dabral et al.

It is certified that error appears in the above-identified patent and that said Letters Patent is hereby corrected as shown below:

Column 1,
Line 12, delete "Modem" and insert -- Modern --.
Line 19, delete "modem" and insert -- modern --.

Column 3,
Line 59, after "during" delete -- a --.

Column 8,
Line 63, after "includes" delete -- a --.

Signed and Sealed this

Twenty-fifth Day of December, 2001

Attest:

Attesting Officer

JAMES E. ROGAN
Director of the United States Patent and Trademark Office